United States Patent
Lau

(10) Patent No.: US 11,778,781 B2
(45) Date of Patent: Oct. 3, 2023

(54) METHOD AND SYSTEM FOR IN-SITU MEASURING OF A HEAT TRANSFER FLUID IN A DEVICE FOR IMMERSION COOLING AND DEVICE FOR IMMERSION COOLING

(71) Applicant: LiquidStack Holding B.V., Amsterdam (NL)

(72) Inventor: Kar-Wing Lau, Hong Kong (HK)

(73) Assignee: LIQUIDSTACK HOLDING B.V., Amsterdam (NL)

( * ) Notice: Subject to any disclaimer, the term of this patent is extended or adjusted under 35 U.S.C. 154(b) by 0 days.

(21) Appl. No.: 17/981,824

(22) Filed: Nov. 7, 2022

(65) Prior Publication Data

US 2023/0062164 A1      Mar. 2, 2023

Related U.S. Application Data

(63) Continuation of application No. 17/141,687, filed on Jan. 5, 2021, now Pat. No. 11,528,827.

(60) Provisional application No. 62/959,358, filed on Jan. 10, 2020.

(51) Int. Cl.
*H05K 7/20* (2006.01)
*G01N 11/00* (2006.01)

(52) U.S. Cl.
CPC .............. *H05K 7/203* (2013.01); *G01N 11/00* (2013.01); *H05K 7/20145* (2013.01); *H05K 7/20318* (2013.01); *H05K 7/20327* (2013.01); *H05K 7/20381* (2013.01)

(58) Field of Classification Search
CPC .......................... H05K 7/20235; H05K 7/203
See application file for complete search history.

(56) References Cited

U.S. PATENT DOCUMENTS

| | | | |
|---|---|---|---|
| 4,296,472 A | 10/1981 | Sarkis | |
| 4,650,637 A * | 3/1987 | Chubb | G21C 17/06 376/253 |
| 6,980,293 B1 | 12/2005 | Harada | |
| 10,169,624 B2 * | 1/2019 | Campbell | H05K 7/20318 |
| 10,765,033 B1 * | 9/2020 | Keehn | H05K 7/203 |
| 10,925,188 B1 | 2/2021 | Keehn et al. | |
| 11,064,634 B1 | 7/2021 | Enright et al. | |
| 2014/0067329 A1 | 3/2014 | Wang et al. | |
| 2016/0139104 A1 | 5/2016 | Massey et al. | |

(Continued)

FOREIGN PATENT DOCUMENTS

WO        2018106381 A1     6/2018

OTHER PUBLICATIONS

International Search Report and Written Opinion in PCT/EP2021/050294, dated Apr. 20, 2021, 13 pages.

*Primary Examiner* — Long T Tran

(57) ABSTRACT

A method and system for controlling operation of an immersion cooling system to filter a heat transfer fluid having an immersion cooling tank adapted to contain the heat transfer fluid used to immersion cool a heat-generating object contained therein, the method and system comprises: sampling the heat transfer fluid in the tank; measuring at least one property or parameter of the sampled heat transfer fluid; generating and transmitting measurement data to a control unit; comparing measurement data with respective threshold data using the control unit; and filtering the heat transfer fluid with a filter based on the comparison results of the control unit.

20 Claims, 3 Drawing Sheets

(56) References Cited

U.S. PATENT DOCUMENTS

| | | | |
|---|---|---|---|
| 2017/0303443 A1 | 10/2017 | Inano et al. | |
| 2019/0082556 A1 | 3/2019 | Inano et al. | |
| 2019/0159359 A1 | 5/2019 | Tung et al. | |
| 2019/0325668 A1* | 10/2019 | Cole | G05D 1/0692 |
| 2019/0357379 A1 | 11/2019 | Kolar | |
| 2020/0386488 A1* | 12/2020 | Smith | C07D 241/04 |
| 2021/0022263 A1 | 1/2021 | Enright et al. | |
| 2021/0223195 A1* | 7/2021 | Surampudi | G01K 13/00 |
| 2021/0246886 A1* | 8/2021 | Lamanna | C07C 317/04 |
| 2021/0327787 A1* | 10/2021 | Yang | H01L 23/427 |

\* cited by examiner

METHOD AND SYSTEM FOR IN-SITU MEASURING OF A HEAT TRANSFER FLUID IN A DEVICE FOR IMMERSION COOLING AND DEVICE FOR IMMERSION COOLING

CROSS-REFERENCE TO RELATED APPLICATIONS

This application claims priority to and the benefit of U.S. Provisional Patent Application Ser. No. 62/959,358, filed Jan. 10, 2020, and a continuation of U.S. patent application Ser. No. 17/141,687 filed Jan. 5, 2021 and published Jul. 15, 2021 as US2021/0219455A1, both of the disclosures are incorporated herein by reference in its entirety.

FIELD OF THE INVENTION

The present invention relates to immersion cooling equipment and to testing techniques of heat transfer fluid contained in immersion cooling tanks, and, more specifically, to immersion cooling devices equipped with in-situ measuring and control means.

BACKGROUND OF THE INVENTION

Immersion cooling is a cooling technique used with computer systems, IT components, electronic devices, electrical devices, and the like (hereinafter collectively referred to as electronics) by which electronics, including complete servers, may be submerged in a thermally-conductive, liquid dielectric or coolant known as a heat transfer fluid. Heat is removed from the system by convection and conduction, by circulating the heat transfer fluid into direct contact with hot components, then through cooling heat exchangers. Immersion cooling has the potential of becoming a popular IT cooling solution as it allows operators to drastically reduce energy usage through the elimination of expensive air cooling infrastructure including on-board fans, compressors, necessary duct work, and other active ancillary systems, such as dehumidifiers and so forth.

Conventionally, with immersion cooling systems, electronics are placed inside an immersion cooling tank, such that heat transfer fluid covers the heat-generating area of the electronics in order to ensure effective heat removal. Disadvantageously, over time and with repeated use during cooling operations, heat transfer fluid may become contaminated, e.g., by particles, impurities, solid substances, liquid substances, and the like.

Exemplary sources of impurities/contaminants may include fine- to coarse-grained solid particles, liquid contaminants that do not dissolve in the heat transfer fluid, liquid contaminants that partially dissolve in the heat transfer fluid, liquid contaminants that dissolve fully in the heat transfer fluid, printed circuit board (PCB) fluxes, plasticizers, water, and so forth. Fluxes, e.g., resin and rosin, may originally be found on the PCB but can be washed out from the PCB by the heat transfer fluid. Typical fluxes have boiling points that may vary between about 100° C. and about 130° C. Plasticizers include additives used to improve, for example, the softness of the plastic typically found in the coatings of some electrical cables. As with fluxes, heat transfer fluid may wash out the plasticizers, e.g., from the electrical cables, which then remain suspended or go into solution in the heat transfer fluid. Due to the repeated heating and cooling of electronics, water vapor in the air can condense and subsequently go into solution in the heat transfer liquid.

As a result of this contamination, the heat transfer fluid may become less effective as a cooling agent. In particular, repeated use of the heat transfer fluid may affect the fluid's electrical resistivity, which is a measure of the fluid's resistance to the transmission of electricity, which might be harmful to the electronics.

A recent implementation of heat transfer fluid as a cooling agent involves immersion cooling of electronics, and, more particularly, involves single-phase or two-phase liquid cooling of electronics. When dielectric fluid, e.g., a liquid dielectric, is used repeatedly in immersion cooling, its electrical resistivity, optical transmittance, and/or other properties may be deleteriously affected. Hence, in order to ensure that the working heat transfer fluid is maintained in or proximate its pure form or pure state, the heat transfer fluid should remain extremely clean and essentially free of liquid and/or solid contaminants, such that electrical resistivity, optical transmittance, boiling point, relative permittivity, and other properties of the heat transfer fluid remain within acceptable limits.

Contamination of the heat transfer fluid may lower its resistivity, heat capacity, boiling point, and so forth on the one hand and increase humidity in an immersion cooling tank, deteriorate heat transfer, and so forth on the other hand. This might cause overheating, inoperability, and/or destruction of the electronics immersed.

One technique to counter this deterioration is to regularly, manually test the heat transfer fluid when the tank is still in operation. Disadvantageously, opening the immersion cooling tank to sample heat transfer fluid manually for testing may allow some of the heat transfer fluid to escape into the environment as vapor. Because heat transfer fluids can be very expensive, there are monetary costs associated with manual sampling. Moreover, external measurements require time and skilled manpower.

Another technique is to immediately or rapidly shut down the electronics and the immersion cooling system to sample the heat transfer fluid. While the electronics and immersion cooling system are offline, however, there is a potential loss of productivity and potential data loss, which are also undesirable.

SUMMARY OF THE INVENTION

One purpose of the invention is to provide a method and a device for in-situ measuring of a heat transfer fluid stored in an immersion cooling tank. Another purpose of the invention is to provide control over an immersion cooling device on the basis of in-situ measured data. One objective of this invention is to provide an apparatus that provides permanent or periodic testing and monitoring of properties of the heat transfer fluid directly in the immersion cooling tank (i.e. in-situ measurements).

In a first aspect, the present invention relates to a method for controlling operation of an immersion cooling system having an immersion cooling tank adapted to contain a heat transfer fluid and used to immersion cool a heat-generating object contained therein. In some embodiments, the method includes sampling a volume of the heat transfer fluid while the object remains in an operating state; measuring one or more property or parameter of the sampled heat transfer fluid volume; generating and transmitting measurement data to a control unit; comparing measurement data with respective threshold data using the control unit; and controlling operation of the immersion cooling system with the control unit based on the comparison. In some implementations, the heat transfer fluid cools the object using at least one of single-phase immersion cooling or two-phase immersion cooling and/or sampling may include pumping the sampled volume of the heat transfer fluid from the immersion cooling tank into a sample chamber. In some variations, the method may further include filtering the sampled volume of the heat transfer fluid prior to measuring.

In some applications, based on the comparison of measured property/parameter data and stored threshold data, the method may also include one or more of: controlling a humidity within the immersion cooling tank (e.g., by operating or activating a desiccant fan in communication with an inner plenum contained within the immersion cooling tank to remediate excessive humidity in the immersion cooling tank); when measurement data exceeds threshold data, generating and transmitting, by the control unit, a signal of the unsuitability of the heat transfer fluid in the immersion cooling tank; when resistivity measurements are lower than respective threshold resistivity values, generating and transmitting signals to activate a pump, to force heat transfer fluid through a filter member to remove at least one of water, undissolved impurities, or dissolved impurities contained in the heat transfer fluid; and/or generating and transmitting signals to turn off the immersion cooling system.

In a second aspect, the present invention relates to an immersion cooling system for cooling an object(s) immersed in an immersion cooling tank adapted to contain a heat transfer fluid. In some embodiments, the system includes: a sampling and testing system, as well as a control unit structured and arranged to receive a signal(s) containing measurement data and to control operation of the immersion cooling system based thereon, such that sampling and testing occur while the object disposed in the immersion cooling system remains in an operating state. In some implementations, the control unit may be further adapted to remediate the heat transfer fluid in the immersion cooling tank.

In some implementations, the sampling and testing system may include a sample chamber(s) disposed in a plenum space proximate the heat transfer fluid in the immersion cooling tank; a pump for transporting a sample of the heat transfer fluid from the immersion cooling tank into the sample chamber via at least one conduit; and a testing unit containing a sensing device(s) (e.g., a resistivity sensor, a relative permittivity sensor, a temperature sensor, or a water content sensor) for measuring one or more property or parameter of the sampled heat transfer fluid and for generating and for transmitting a signal(s) containing measurement data to the control unit.

Optionally, the system may also include one or more of: a heat exchanger in fluid communication with the immersion cooling tank for removing heat from the heat transfer fluid, a condensing device for condensing heat transfer fluid in a vapor state in the plenum space, a desiccant fan disposed in the plenum space, and a filter member in fluid communication with the pump. In some variations, the filter member may be selected from a group that includes: a carbon filter, an ion exchange polymer filter, a ceramic filter, or combinations thereof.

DETAILED DESCRIPTION OF THE INVENTION

Figure 1:
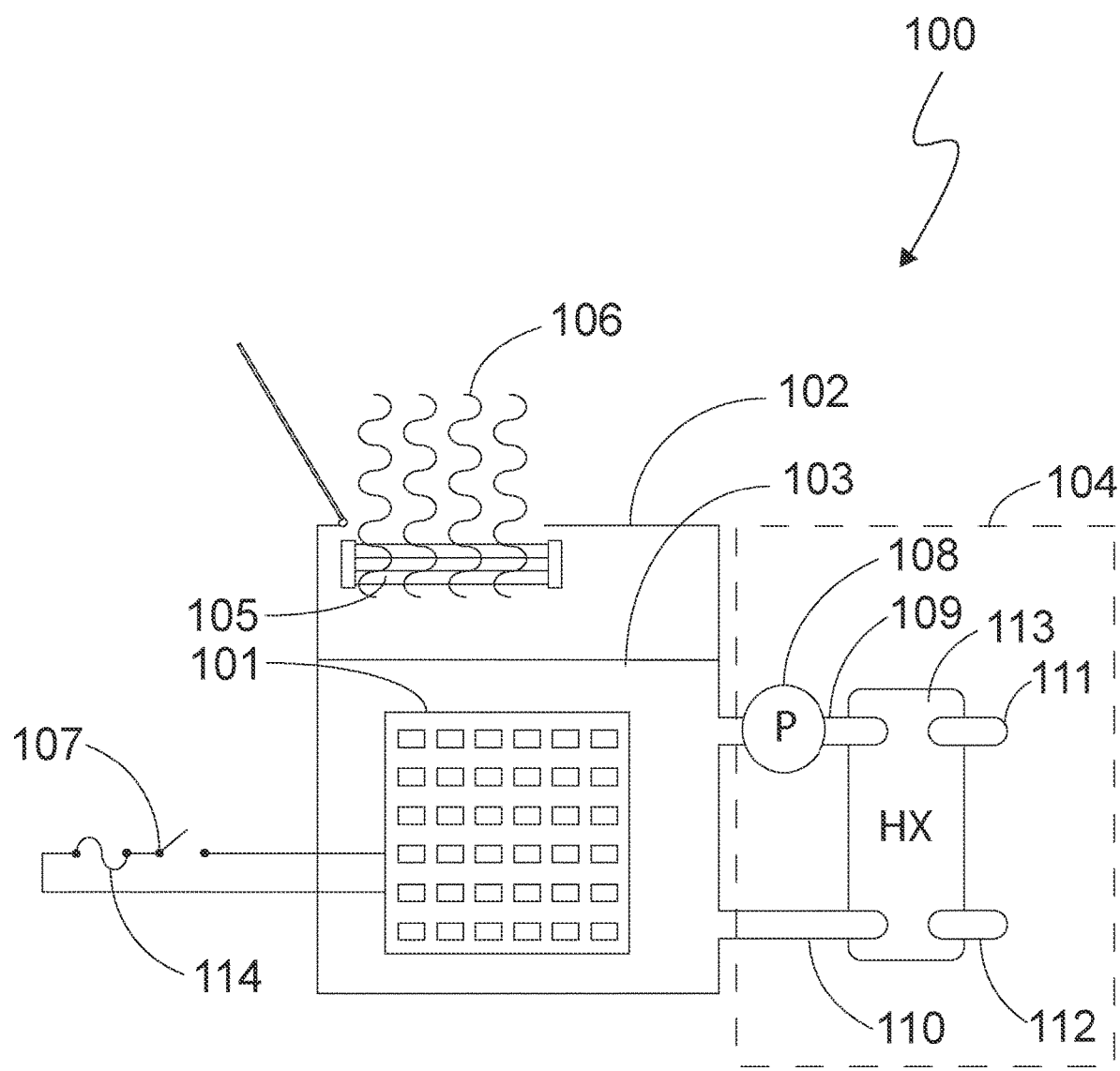
FIG. 1 depicts an immersion cooling device having no measuring facilities, in accordance with the prior art.

Referring to FIG. 1, an illustrative embodiment of an immersion cooling system 100 is shown. The system 100 is structured and arranged to immersion cool objects 101, such as electronics. In some implementations, the system 100 includes an immersion cooling tank 102 that is adapted to contain a bath of a heat transfer fluid 103 that is configured to submerge all or some portions of the object 101. The object 101 may be operatively coupled to a power source 114, e.g., through a switch 107. In some variations, the heat transfer fluid could be a dielectric fluid, e.g., a liquid dielectric. In further variations, the heat transfer fluid could be a fluorinated chemical.

Depending on whether the system 100 is for single-phase or two-phase immersion cooling, the system 100 may also include a heat exchanger 104 and/or a condensing device 105. Heat removal by immersion cooling may include direct and indirect methods, as well as single- and two-phase approaches. For example, for two-phase immersion cooling, in a first phase, heat generated by the object 101 vaporizes the heat transfer fluid 103 in which the object 101 is immersed or submerged. The heat transfer fluid vapor 106 rises above the level of the heat transfer fluid 103. In a second phase, the heat transfer fluid vapor 106 produced in the immersion cooling tank 102, upon contact with an exterior surface of the condensing device 105, e.g., condensing coils through which a cooling fluid flows at a pre-determined flow rate and temperature, condenses. The condensate may then be added back, e.g., by gravity feeding, into the immersion cooling tank 102. In some embodiments, vapor 106 can be irreversibly removed from the immersion cooling tank 102 through an opening and/or a conduit provided for that purpose.

For single-phase immersion cooling, heat generated by operating heat-generating objects 101 may be removed through forced convection and/or conduction of the liquid heat transfer fluid 103 via a pump 108 that is structured and arranged to circulate the heat transfer fluid 103 through an inlet conduit 109 at a pre-determined flow rate and temperature, to and through a (e.g., liquid-to-liquid) heat exchanger 113, returning the cooled heat transfer fluid 103 back into the immersion cooling tank 102, e.g., via an outlet conduit 110. An external inlet conduit 111 and outlet conduit 112 circulate another (e.g., cooling) heat transfer fluid at another pre-determined flow rate and temperature through the heat exchanger 113, to remove heat from the heat transfer fluid 103.

In the course of operating the immersion cooling system 100, properties of the heat transfer fluid 103 change because of different contaminants that may be contained in the heat transfer fluid. For example, the contaminants may affect or alter the boiling point of the heat transfer fluid 103, its resistivity, and so forth. Problematically, lack of information about the heat transfer fluid 103 properties raises the risk of overheating and destruction of all or come portion of the object 101. Thus, without a built-in system for in-situ measurements it is required to take measurement periodically with external tools. For in-situ sampling of the heat transfer fluid 103 contained in the immersion cooling tank 102 shown in FIG. 1, the tank 102 must be opened so that a sample of the heat transfer fluid 103 may be taken manually. Opening the immersion cooling tank 102, however, introduces greater loss of the heat transfer fluid vapor 106 and also may introduce further contaminants from the ambient environment into the heat transfer fluid 103. Indeed, humidity and numerous pollutants may penetrate into the immersion cooling tank 102, when the tank 102 is opened for sampling.

Immersion Cooling System

Figure 2:
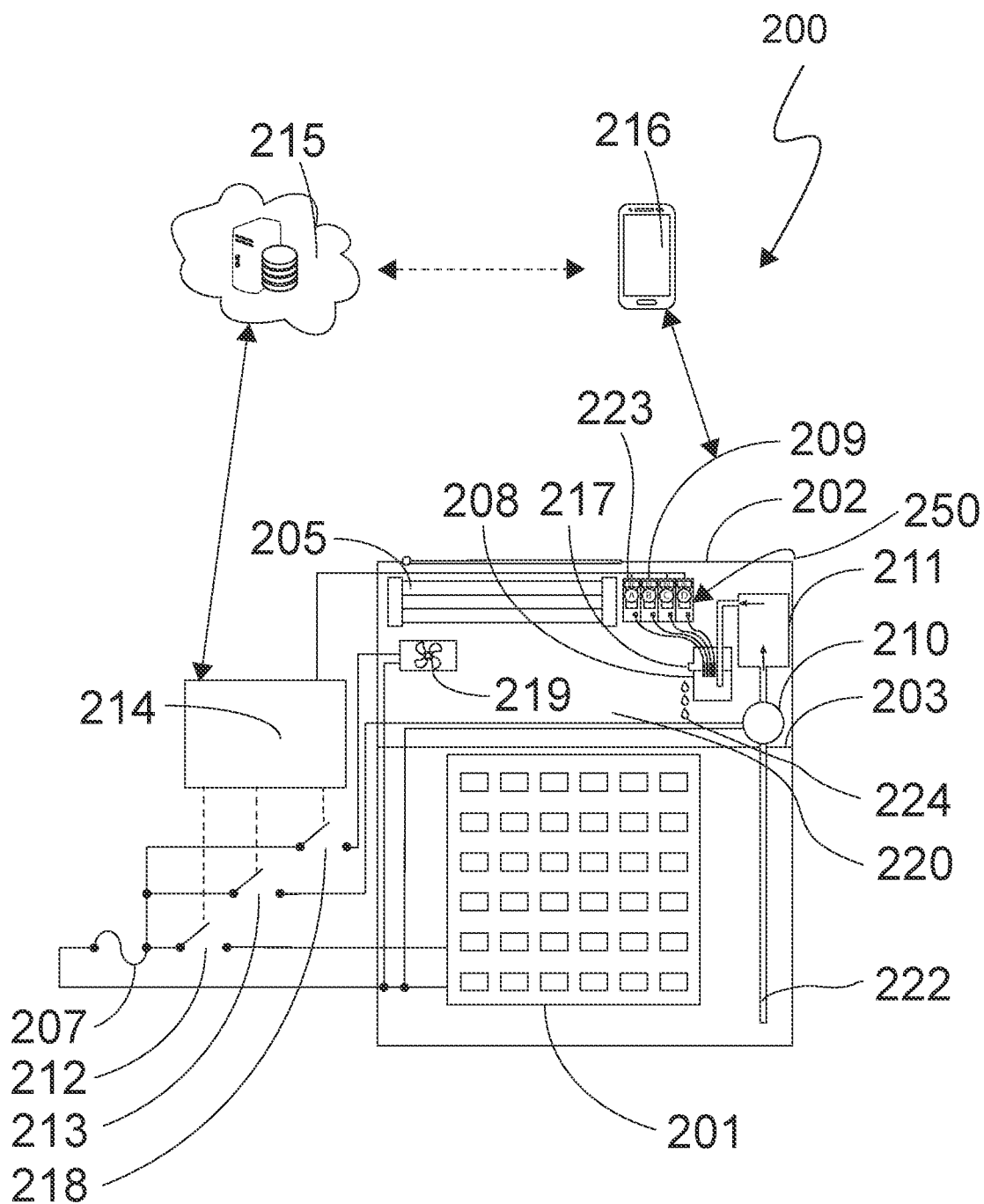
FIG. 2 depicts a device for immersion cooling equipped with in-situ measuring facilities, in accordance with some embodiments of the present invention.

FIG. 2 shows an illustrative embodiment of an immersion cooling system 200 for immersion cooling of at least one object 201. Advantageously, the system 200 includes a sampling and testing system 250 for automatically sampling heat transfer fluid 203 to ascertain its properties and/or parameters. In some implementations, the system 200 may include an immersion cooling tank 202 that is structured and arranged for containing a volume of a heat transfer fluid 203, as well as a plenum 220 volume above the surface level of the heat transfer fluid 203. In some variations, e.g., with two-phase immersion cooling, the system 200 may include a condensing device 205 that is structured and arranged for disposal within the immersion cooling tank 202. Preferably, at least one sample chamber 208 may be disposed inside the immersion cooling tank 202.

For example, in some implementations, the sample chamber 208 may be fixedly or removably attached, adhered, and the like to an inner surface of the immersion cooling tank 202 within the plenum 220, at a pre-determined elevation above the surface level of the heat transfer fluid 203 and/or the object(s) 201 contained in the heat transfer fluid 203. Preferably, the sample chamber 208 and the testing unit 209 are isolated from the heat transfer fluid 203 in the immersion cooling tank 202 (e.g., within the plenum 220 space) but, otherwise, may be located in any area within the immersion cooling tank 202. Disposing the sample chamber 208 above the cooling bath has the added advantage of providing a space above the sampled heat transfer fluid within the sample chamber 208 for sampling and testing the vapor.

Although the testing of the heat transfer fluid 203 may be performed within the cooling bath, sampling and testing within a cooling bath containing a boiling heat transfer fluid 203 may result in larger variations of the parameters and/or properties of the heat transfer fluid 203 than might otherwise be the case when sampling and testing is performed outside of the cooling bath. Additionally, disposing the sample chamber 208 outside of the cooling bath of heat transfer fluid 203 may facilitate replacement and/or repair of the sensors A, B, C, D within the testing unit 209.

A pump 210 in fluidic communication between the sample chamber 208 disposed in the plenum 220 space and the heat transfer fluid 203 may be configured to deliver a, e.g., pre-determined volume of, sample of the heat transfer fluid 203 from the tank 202 into the sample chamber 208, e.g., via a conduit 222. In some implementations, the pump 210 may fluidically communicate with the sample chamber 208 through a filter member 211, e.g. a carbon filter, an ion exchanger polymer, a ceramic filter, and combinations thereof. Optionally, the immersion cooling tank 202 may also include a desiccant fan 219 that is adapted, e.g., when selectively activated by a control unit 214, to dry out the air and vapor inside the tank 202. In some applications, the desiccant fan 219 may include a fan and a desiccant material.

The sample chamber 208 is also configured to return the sample of the heat transfer fluid 203 back to the tank 202. For this purpose, the sample chamber 208 can be equipped with a vent 217 that is adapted to maintain the sample within the sample chamber 208 at a constant level, e.g., by draining excess sampled heat transfer fluid back into the immersion cooling tank 202. As heat transfer fluid 203 is pumped into the sample chamber 208, it accumulates. Eventually, the level of the sampled heat transfer fluid within the sample chamber reaches the level of the vent 217 at which point, the excess sampled heat transfer fluid will flow out of the vent 217, returning to the immersion cooling tank 202.

Testing Unit

The system 200 further includes a testing unit 209. In some embodiments, the testing unit 209 may include at least one sensor configured to take one or a plurality of measurements of the parameters or properties of the sample of heat transfer fluid 203 contained in the sample chamber 208. In some implementations, the testing unit 209 may include a set of sensors, e.g. a resistivity sensor (A), a relative permittivity sensor (B), a temperature sensor (C), a water content sensor (D), and the like. The sensors A, B, C, D may have a probe to contact the sample of the heat transfer fluid 203 contained in the sample chamber 208 and, moreover, may be adapted to produce electrical signals, as necessary. In some implementations, each sensor A, 13, C, D may have a corresponding display screen 223 to display the measurement results directly in the testing unit 209.

The system 200 may also include a control unit 214 configured to trigger the sensor measurements with the testing unit 209, to get measured data and to control operation of the system 200. For instance, in one implementation, the control unit 214 can control the pump 210 (e.g., by opening or closing the electrical relay 213 to turn the pump 210 OFF and ON, respectively). In some variations, the control unit 214 may include a wireless local area network (WLAN) module to transfer data from the testing unit 209 to (e.g., online) storage device 215. In some implementations, the control unit 214 may be implemented by a personal electronic computing device selected from a group including: a tablet computer, a personal computer, a smartphone 216, a wearable smart device, a programmable logic controller with a software application providing the receipt and display of information about the state of the sample in the sample chamber 208, or a combination thereof.

In some embodiments, the object 201 is connected to a, e.g., electrical, power source 207 via an electrical relay 212. The pump 210 may also be connected to the power source 207 via an electrical relay 213. The desiccant fan 219 may be connected to the power source 207 via an electrical relay 218. All electrical relays 212, 213, 218 may be controlled by the control unit 214. This allows all electrical parts of the system 200 to be controlled with the same control unit 214.

In some embodiments, after installation of the testing unit 209 in the tank 202, the user may activate the connection of the sensors to the Internet and to the online storage 215 as follows. The control unit 214 can be connected to the testing unit 209 via a wireless personal area network (WPAN) module (not shown). Due to the presence of the corresponding software and hardware, the control unit 214 can provide a connection for the transmission of data between the testing unit 209 and one of the available wireless local area networks (WLAN) for connecting to the Internet. After the first such connection, the testing unit 209 establishes communication to the online storage 215, which automatically creates an AccountID for the sensor in the cloud storage. Every sensor A, B, C, D may include a unique identification number DeviceID. The control module 214, providing communication to the testing unit 209 and its management, has a unique identification number, e.g. in accordance with UUID standard. As a result of the aforementioned first connection, the identifiers DeviceID and UUID are linked to the created AccountID, and each of the sensors A, B, C, D is assigned its own identification number SensorID.

Thus, the testing unit 209; each sensor A, B, C, D; and the control module 214 are linked to the account in the online storage 215. Optionally, several control units with different UUIDs can also be linked to the same AccountID. The same control unit 214 (with its unique UUID) can be linked to different AccountIDs for controlling several immersion cooling systems 200. This allows controlling, via a single control unit 214, several immersion cooling systems 200 equipped with corresponding testing units 209, as well as controlling the same immersion cooling system 200 equipped with the testing unit 209, via several control units with different UUID identifier.

In some implementations, data from the online storage 215 may also be transferred to a portable external computer or a smartphone 216 for display. In some embodiments, the testing unit 209 can be equipped with software and hardware providing direct wireless connection between the sensors A, B, C, D of the testing unit 209 and the smartphone 216, as shown in FIG. 2.

Operation of Immersion Cooling System

Figure 3:
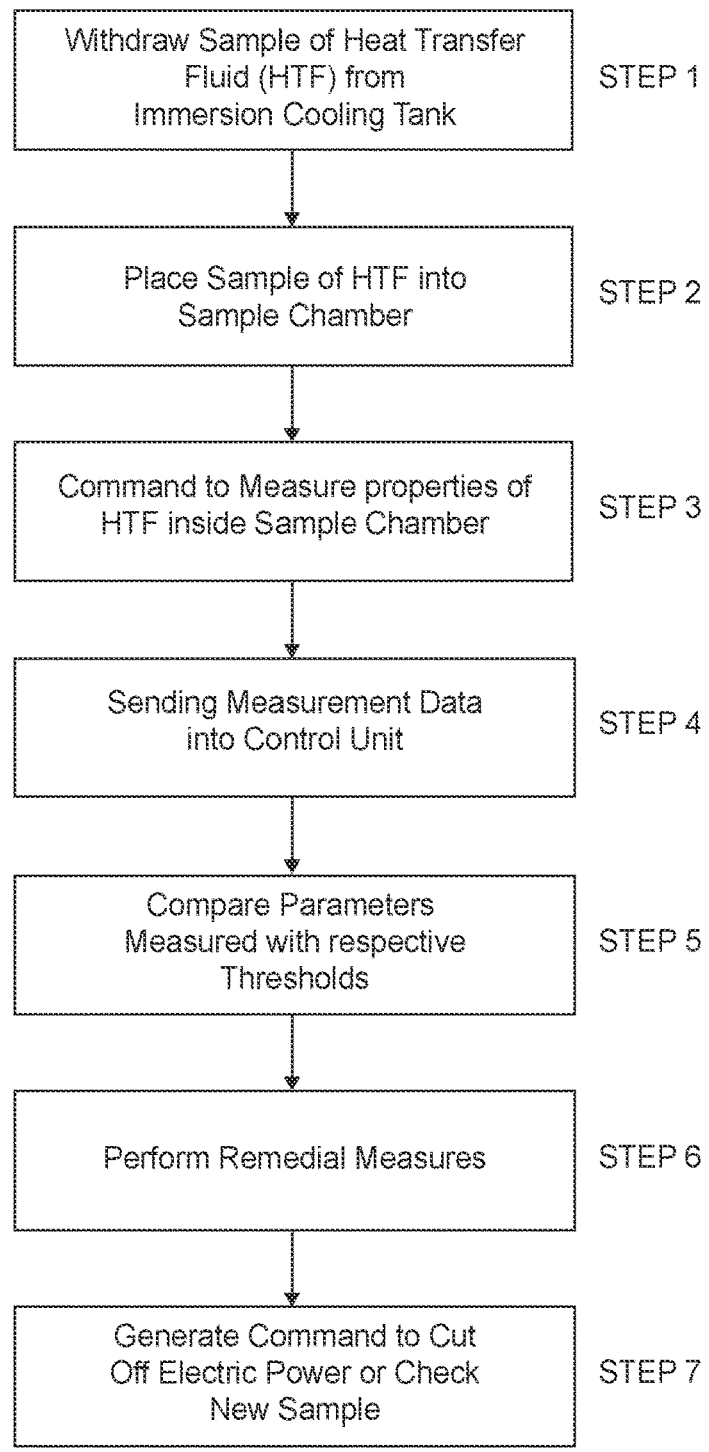
FIG. 3 shows a flow diagram depicting the operation of the device for immersion cooling, in accordance with some embodiments of the present invention.

Referring to FIG. 3, operation of the immersion cooling system 200 will now be described. Under normal operating conditions, the control unit 214 may generate and transmit a signal to close the electrical relay 212, such that power is delivered to the object 201 immersed or submerged in the heat transfer fluid 203 contained in the immersion cooling tank 202. Periodically or continuously, automatically or manually, the control unit 214 may generate and transmit a signal to close the electrical relay 213, causing the pump 210 to pump heat transfer fluid 203, e.g., a pre-determined volume of heat transfer fluid 203, from the tank 202 into the sample chamber 208 (STEP 1). As soon as the quantity of the heat transfer fluid 203 reached a pre-determined level in the sample chamber 208 (STEP 2), the control unit 214 generates and transmits a signal to open the electrical relay 213, causing the pump 210 to stop further pumping. Optionally, the control unit 214 may be adapted to generate and transmit a signal to open the vent or the valve 217 to drain excess fluid from the sample chamber 208 back into the immersion cooling tank 202.

Once the sample chamber 208 is filled with a heat transfer fluid sample (STEP 2), the control unit 214 is configured to generate and transmit a signal to the testing unit 209 to measure parameters or properties of the sample withdrawn (STEP 3). In some implementations, the sensors A, B, C, D of the testing unit 209 measure a set of parameters, e.g. resistivity, relative permittivity, optical transparency, temperature, and water content. For the purpose of illustration rather than limitation, resistivity may be tested using an insulation resistance tester, relative permittivity may be tested using an open-ended coaxial probe, optical transparency may be tested using a transparency meter, temperature may be tested using a thermocouple or a resistance temperature detector (RTD), and water content may be measured (e.g., directly) using an infrared spectroscope or (e.g., indirectly) using a humidity sensor on a sample of the vapor.

The measured parameter (or property) data from each sensor A, B, C, D of the testing unit 209 may then be transmitted to the control unit 214 (STEP 4) that is configured to compare the data with respective thresholds stored in its memory (STEP 5). For example, the thresholds may be the parameter values or properties associated with new or fresh heat transfer fluid. If the parameters/properties measured remain within acceptable levels, the heat transfer fluid 203 in the system 200 may be deemed to be suitable and acceptable for continued heat removal. Depending on the particular embodiment, the measured parameter data may be transferred to the online storage 215 and/or to the smartphone 216 for storage and later use.

If, however, the control unit 214 detects that any of parameters/properties are not within acceptable pre-determined threshold, the control unit 214 may generate and transmit a warning signal, e.g., displaying a warning notification, sending an e-mail, text notification, or other medium to inform the operator that the heat transfer fluid 203 is unacceptable or unsuitable for heat removal and may damage all or some portion of the object(s) 201. In some implementations, there are remedial measures that the control unit 214 may initiate without human intervention to improve the parameters (STEP 6). For example, if humidity or water content in the heat transfer fluid 203 exceeds its pre-determined threshold, the control unit 214 may close the electrical relay 218 to switch on the desiccant fan 219, removing moisture from the heat transfer fluid vapor 106. As another example, if the measured resistivity of the sampled heat transfer fluid is too low comparing to the pre-determined threshold, then the control unit 214 may generate and transmit a signal(s) to close the electrical relay 218 to switch on the desiccant fan 219, as well as generate and transmit a signal(s) to close the electrical relay 213 to activate the pump 210, forcing heat transfer fluid 203 through the filter member 211. Filtering heat transfer fluid 203 containing undissolved and/or dissolved impurities through the filter member 211 is intended to remove water and other undissolved and/or dissolved impurities from the heat transfer fluid 203.

While the control unit 214 performs any remedial measures (STEP 6), the system 200 continues to sample the heat transfer fluid 203 (STEP 1) from the tank 202 and the sensors A, B, C, D continue to measure their respective material parameters/properties of the sampled heat transfer fluid (STEP 3). If, after comparison with respective thresholds (STEP 5), the parameters have not improved in a pre-determined period of time, the control unit 214 may be configured to open the electrical relay 212, safely cutting-off power to the object 201 (STEP 7), thereby preventing destruction of the object 201.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein

What is claimed is:

1. An immersion cooling system for dissipating heat generated from at least one object immersed in an immersion cooling tank adapted to contain a heat transfer fluid, the system comprising:
   a testing unit containing at least one sensing device for measuring at least one property of the heat transfer fluid in the immersion cooling tank while the immersion cooling system is operating;
   the sensing device generates and transmits a signal representative of the measured property to a control unit, and
   wherein the control unit remediates the heat transfer fluid in the immersion cooling tank, the remediation is selected from a group consisting of shutting down the immersion cooling system to replace the heat transfer fluid; circulating the heat transfer fluid through a filter system; adding heat transfer fluid to the immersion cooling tank, and reducing power to at least one object being cooled during filtering of the heat transfer fluid, until the measured property is above a threshold value as determined by the control unit.

2. The system of claim of 1, wherein the heat transfer fluid is a two-phase electronic fluid with a boiling point below that of water.

3. The system of claim 1, wherein the heat transfer fluid is a single-phase electronic fluid that does not vaporize.

4. The system of claim 1, further comprising a heat exchanger in fluid communication with the immersion cooling tank for removing heat from the heat transfer fluid.

5. The system of claim 1, further comprising a condensing device for condensing heat transfer fluid into a vapor state back into the immersion cooling tank.

6. The system of claim 1, wherein the signal activates a desiccant fan to remediate excessive humidity in the immersion cooling tank.

7. The system of claim 1, wherein the measuring occurs periodically or continuously.

8. The system of claim 7, wherein the signal activates a pump, when resistivity measurements are lower than respective threshold resistivity values, to force heat transfer fluid through the filter system to remove at least one of water, undissolved impurities, or dissolved impurities contained in the heat transfer fluid.

9. The system of claim 8, further comprising a filter member in fluid communication with the pump.

10. The system of claim 9, wherein the filter member is selected from the group comprising: a carbon filter, an ion exchange polymer filter, a ceramic filter, or combinations thereof.

11. The system of claim 10, wherein the control unit is adapted to activate the pump to force heat transfer fluid through a filter member to remove at least one of water, undissolved fluids, and dissolved fluids from the heat transfer fluid.

12. The system of claim 1, wherein the sensing device is selected from the group comprising: a resistivity sensor, a relative permittivity sensor, a temperature sensor, or a water content sensor.

13. The system of claim 1, wherein a separate plenum is in fluid communication with the immersion cooling tank, and further the plenum is a fluid sample chamber containing the fluid tested by the testing unit.

14. A method of operating an immersion cooling system for dissipating heat generated from at least one object immersed in an immersion cooling tank adapted to contain a heat transfer fluid, the method comprising:
sampling a volume of the heat transfer fluid in the immersion cooling tank while the object remains in an operating state;
testing for at least one property of the heat transfer fluid in the immersion cooling tank while the immersion cooling system is operating;
generating and transmitting a signal representative of the measured property to a control unit, and
controlling the operation of a filter system to remediate the heat transfer fluid in the immersion cooling tank, the remediating is selected from a group consisting of shutting down the immersion cooling system to replace the heat transfer fluid; circulating the heat transfer fluid through a filter system; replenishing the heat transfer fluid, and reducing power to at least one object being cooled during filtering of the heat transfer fluid, until the measured property is above a threshold value as determined by the control unit.

15. The method of claim 14, wherein the filter system further comprising filtering the heat transfer fluid through a filter member, the filter member is selected from the group comprising: a carbon filter, an ion exchange polymer filter, a ceramic filter, or combinations thereof.

16. The method of claim 14, wherein the sensing device measuring the electronic fluid selected from the group comprising: a resistivity sensor, a relative permittivity sensor, a temperature sensor, or a water content sensor.

17. The method of claim 16, wherein the signal activates a desiccant fan to remediate excessive humidity in the immersion cooling tank.

18. The method of claim 15, wherein the signal activates a pump, when the resistivity sensor measurement is lower than the threshold value, to pump heat transfer fluid through the filter member to remove at least one of water, undissolved impurities, or dissolved impurities contained in the heat transfer fluid.

19. The method of claim 14, wherein the signal turns off the immersion cooling system.

20. The method of claim 16, wherein the sampling occurs periodically or continuously.

* * * * *